United States Patent [19]

Correale, Jr. et al.

[11] Patent Number: 4,918,334
[45] Date of Patent: Apr. 17, 1990

[54] BIAS VOLTAGE GENERATOR FOR STATIC CMOS CIRCUITS

[75] Inventors: Anthony Correale, Jr., Raleigh; Gary C. Luckett, Carey, both of N.C.

[73] Assignee: International Business Machines Corporation, Armonk, N.Y.

[21] Appl. No.: 232,399

[22] Filed: Aug. 15, 1988

[51] Int. Cl.⁴ .................. H03K 17/094; H03K 3/01
[52] U.S. Cl. ................ 307/296.8; 307/296.3
[58] Field of Search .............. 307/296.8, 296.3

[56] References Cited

U.S. PATENT DOCUMENTS

| | | | |
|---|---|---|---|
| 4,433,252 | 2/1984 | Lewis | 307/269 |
| 4,563,595 | 1/1986 | Bose | 307/296.8 |
| 4,614,882 | 9/1986 | Parker et al. | 307/296.8 |
| 4,763,021 | 8/1988 | Stickel | 307/296.8 |

OTHER PUBLICATIONS

"A Bias Circuit Compensated for Threshold and Supply Variations", IBM Technical Disclosure Bulletin, by F. Grunberg et al., vol. 16, No. 1 Jun. 1973.

Primary Examiner—Stanley D. Miller
Assistant Examiner—Richard Roseen
Attorney, Agent, or Firm—Joscelyn G. Cockburn

[57] ABSTRACT

A voltage generator, for providing bias voltages which bias static CMOS circuits, includes at least one pull-up device coupled through an output circuit arrangement to a plurality of compensation circuits. The compensation circuits adjust the bias voltage to compensate for supply voltage tolerances and variations caused by device process dependent parameters.

11 Claims, 3 Drawing Sheets

BIAS VOLTAGE GENERATOR FOR STATIC CMOS CIRCUITS

BACKGROUND OF THE INVENTION

1. Field of the Invention

The present invention relates to integrated circuits in general and more particularly to circuit arrangements for biasing selected devices on Very Large Scale Integration (VLSI) chips.

2. Prior Art

Most VLSI chips are being designed with CMOS technology. It is believed that this trend is an attempt to capitalize on the improved power and performance characteristics which the CMOS technology provides. A typical VLSI chip is made up of thousands of circuit arrangements integrated on a single substrate. Some of these circuits, such as programmable logic arrays (PLA), bus with several dotted drivers, etc., require static power dissipating circuits in order to ensure proper operation.

One of the disadvantages of these static circuits is that, at worst case, they dissipate a relatively large amount of power. Because CMOS technology is a low power technology, the presence of static circuits on the CMOS chip negates or undermines one of the benefits associated with the CMOS technology. Even though there are a plurality of different types of static CMOS circuits, an inverter circuit will be used to illustrate the relatively large amount of power which a typical static CMOS circuit dissipates.

FIG. 1 shows a circuit schematic of two typical inverter circuits which include a pair of P-channel devices Q26, Q30, and a pair of N-channel devices Q28, Q32. The source electrodes of the P-channel devices are connected to power supply (Vps) and the source electrodes of the N-channel devices are connected to ground potential. As is the usual practice with static CMOS circuits without availability of depletion NMOS devices, P-channel FET device (Q26) is used as the load device. To effectuate the loading function, the gate electrode of Q1 is connected to the ground potential.

Current in the P-channel device can be expressed by the following simplified equation.

$$I = K(Vgate - Vs - Vt)^2,$$

where

K is a function of parameters such as device width, length, gate oxide thickness, etc.
Vgate is the gate voltage of the P-channel device
Vs is the source of the device, the power supply Vps
Vt is the threshold voltage of the device, typically −1 volt
For the P-channel device shown (Vgate−Vs)=Vps
Vps is the power supply voltage typically 5±10%.

Variations in the process parameters cause K to vary by as much as +/−60% between its −3 sigma limit and its +3 sigma limit. Varying the power supply voltage Vps from 4.5 volts to 5.5 volts increases the current in the P-channel device by 50%. Combining process variations and power supply tolerance, the current in the device can vary more than 400% from worst case (−3 sigma limit) to best case (+3 sigma limit). The −3 sigma and +3 sigma limits are statistical terms used to describe standard deviation from a nominal value.

Circuit performance can improve by a factor of 4 between worst case conditions and best case conditions.

The designer usually has a worst case performance target for the circuit being designed. The designer then must be able to accommodate the power dissipation of the circuit at best case conditions. If there is a significant number of static circuits on a VLSI chip, the power dissipation at best case conditions will raise the chip's junction temperature, reduce its reliability and decrease the performance of other circuits.

A straightforward approach for solving the power dissipation problem is to package the chip in a ceramic casing. Such casing usually has lower thermal resistance which keeps the junction temperature lower. Ceramic packages have lower thermal resistance than plastic packages but are more expensive and will make the component less competitive in the market place. In addition, the increased current stresses the current density limits of metal and contact structures further compounding the reliability issues.

SUMMARY OF THE INVENTION

It is therefore a general object of the present invention to provide an on-chip circuit arrangement which biases static CMOS circuits to reduce the maximum power which is dissipated by the circuits while optimizing performance.

The circuit arrangement includes a plurality of compensating circuits which are coupled through an output circuit to provide an output voltage which is applied to the gate electrodes of P-channel load devices. The voltage compensates for variations due to the process parameters of device channel length, channel width, and threshold voltage. The voltage is also adjusted for variation in the power supply voltage (Vdd).

Generally, compensation is achieved by the technique of ratioing nominal parameters of two FET devices which are connected in series. A plurality of the series connected devices are arranged in parallel to provide a nominal value for a desired output voltage.

More particularly, as shown in FIG. 4, a pair of series connected N-channel devices Q1 and Q2 are positioned between a voltage supply source Vdd and ground potential. The N-channel devices generate a first controlled voltage (at node 1) which is supplied to a series parallel arrangement of FET devices (Q3, Q4 and Q5) which are connected between Vdd and the ground potential. FET devices Q3, Q4 and Q5 provide a second controlled voltage, at control node 2, which is coupled through an inverting stage formed by devices Q6 and Q16 to provide an output biasing voltage Vref. The devices Q1–Q6 compensate for variation in the power supply voltage Vdd and variation in the device parameters.

Compensation for variation in the device threshold voltage (Vt) is provided by devices Q7–Q12. Devices Q7, Q8 and Q10, Q11 form a parallel combination circuitry arrangement between Vdd and ground. Devices Q9 and Q12 interconnect the parallel combination to the control node 2.

The biasing voltage generator can be deactivated by devices Q13–Q15 and Q17. When the +chip power is activated, devices Q13–Q15 effectuate the disabling of all dc power dissipation within the bias generator and the Vref potential rises to the full power supply potential. Vref=Vps reducing to zero all power dissipation in the controlled elements within the design. When activated, device Q17 disables the bias generator providing zero volt potential to all controlled elements. The features associated with devices Q13–Q15 and Q17 are auxiliary to the bias generator function and provide the additional function of auto-override, both for minimum and maximum power checking and testability.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Figure 1:
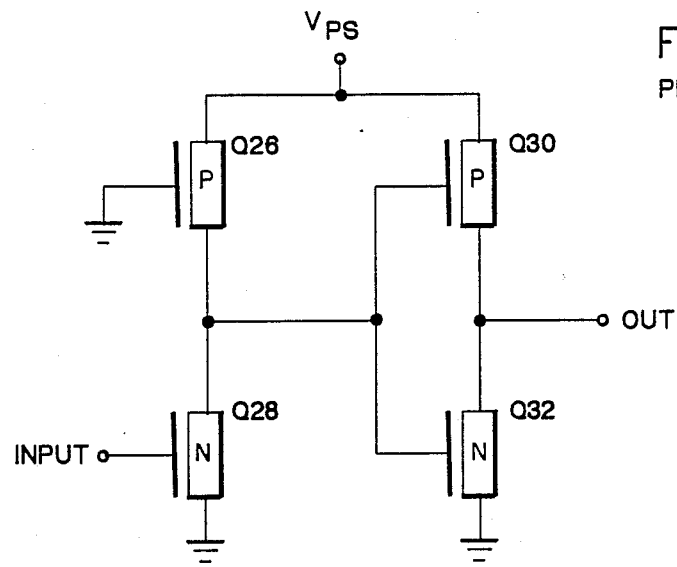
FIG. 1 shows a prior art schematic of a static power dissipating circuit implemented in CMOS technology. The load device is a P-channel FET with its gate electrode connected to ground.
Figure 2:
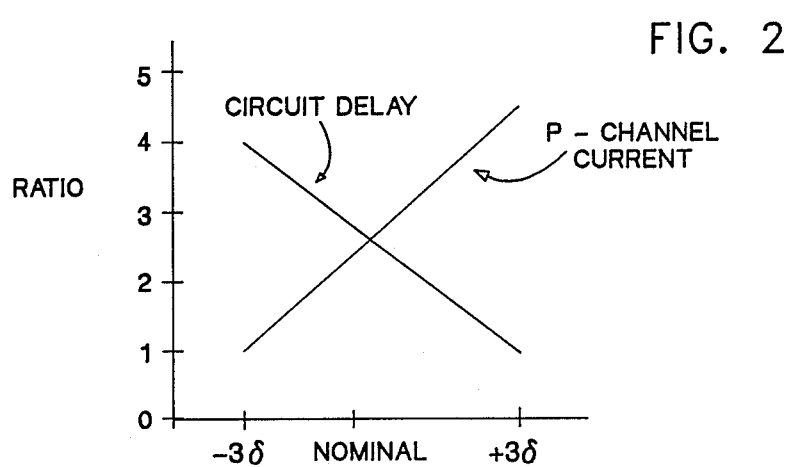
FIG. 2 shows variations in circuit delay and P-channel current versus process parameters and power supply tolerances.

FIG. 2 shows a graph of P-channel load current and circuit delay for load device Q26 connected with its gate electrode connected to ground (FIG. 1). The graph is helpful in understanding the power/performance problems which are corrected by the present invention. As is shown in FIG. 2, the statistical distribution or spread from worst case (−3 sigma limit) to best case (+3 sigma limit) is plotted on the horizontal axis while the normalized circuit delay or P-channel current ratio is plotted on the vertical axis. The variation is caused by tolerances in the power supply voltage (Vps) and variation due to process and/or devices parameters. The curve which represents P-channel current has a positive slope while the curve which represents circuit delay has a negative slope. A casual review of the graph shows that as the device performance varies between −3 sigma and +3 sigma the circuit performance varies by a ratio of 4. To improve this wide variation the present invention was realized.

The essence of the invention is that a voltage generator (to be described subsequently) generates a bias voltage which is connected to the gate or control electrode of the load device Q26 (FIG. 1). The voltage generator compensates for variation due to process parameters and power supply tolerances and reduces the current variation in the load device from 400% to 40%.

Figure 3:
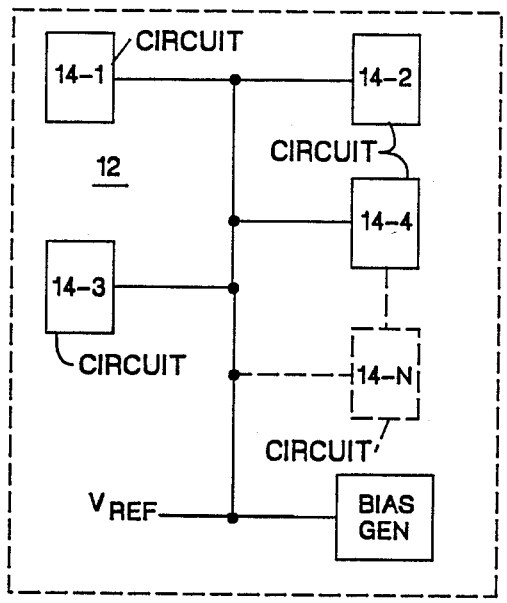
FIG. 3 shows a VLSI chip configured according to the teachings of the present invention.

FIG. 3 shows a VLSI chip 10 configured according to the teachings of the present invention. The chip is exploded or magnified beyond its normal size in order to explain the present invention. In actuality, the surface area of the chip is within millimeter range. Still referring to FIG. 3, the chip comprises of a substrate 12 upon which a plurality of circuit arrangements are integrated. For brevity, only those circuit arrangements which are germane to the present invention are shown, it being understood that the chip is populated with other circuit arrangements which are not shown in the sketch of FIG. 3. A plurality of static CMOS circuit arrangements 14-1 through 14-N are integrated on substrate 12.

The static CMOS circuits may include PLAs, dotted circuits connected as bus structures, inverter circuits, etc. Each of these circuit arrangements includes a pullup device which the present invention biases so as to minimize power dissipation.

In particular, the present invention provides an on-chip bias generator which outputs a voltage reference (Vref) which is connected to the pullup devices (not shown) of each of the static CMOS circuits. For example, if the static CMOS circuit 14-1 through 14-N includes an inverter circuit such as the prior art inverter circuit of FIG. 1, the output Vref from bias generator is connected to the gate electrode of the P-channel enhancement mode device Q1. With this configuration the power performance spread of the P-channel device is brought within acceptable range. Of course, the present invention may be used to bias other types of static CMOS circuits.

Figure 4:
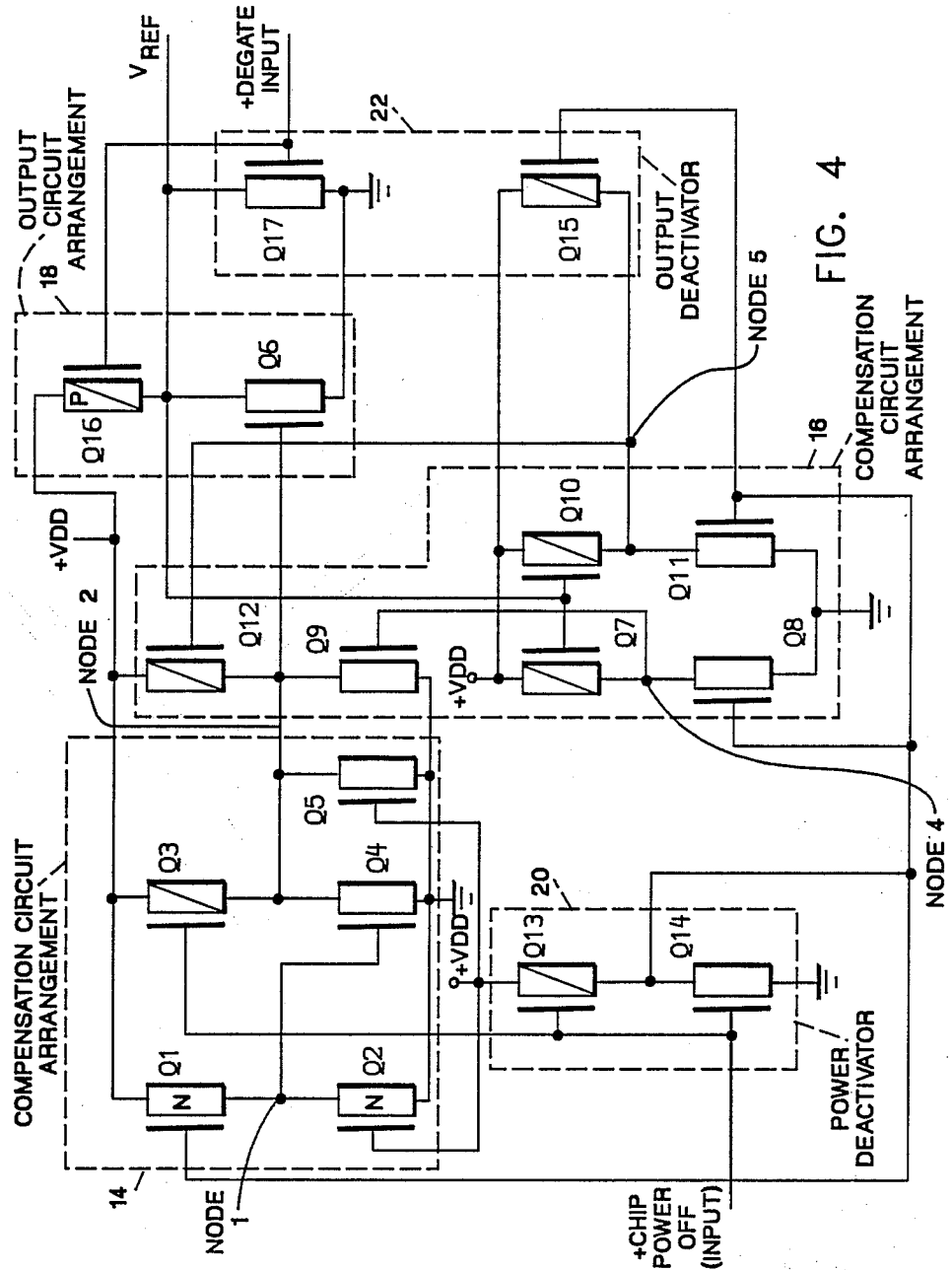
FIG. 4 shows a circuit schematic of the on-chip bias voltage generator according to the teachings of the present invention.

FIG. 4 shows a circuit diagram for the bias voltage generator. The bias voltage generator includes compensation circuit arrangement 14, and compensation circuit arrangement 16. Compensation circuit arrangement 14 compensates for tolerance in the power supply (Vdd) and variation in the device parameters due to process variation. Compensation circuit arrangement 16 adjusts for variation in device threshold voltage (Vt). Compensation circuit arrangements 14 is couple to node 2. Node 2 in turn is connected by output circuit arrangement 18 to V(reference).

In the preferred embodiment of this invention, output circuit arrangement 18 is an inverter circuit formed by devices Q6 and Q16. It should be noted that devices with a diagonal such as Q16 and similar ones are P-channel enhancement mode devices while devices with no diagonals such as Q6 and similar ones are N-channel enhancement mode devices. Circuit arrangements 20 and 22 provide testability features for the voltage generator.

Figure 5:
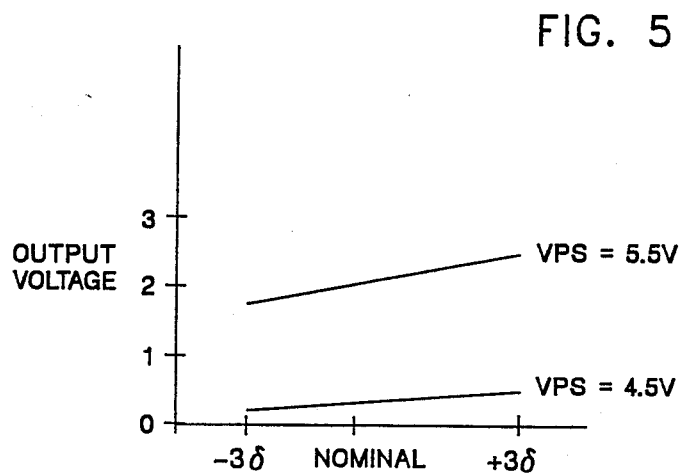
FIG. 5 shows a graph of the output voltage of the voltage generator as the current in the load device varies between −3 sigma and +3 sigma.

Still referring to FIG. 4, compensation circuit means 14 is comprised of series-connected N-channel FET devices Q1 and Q2 which are connected in series between Vdd and ground potential. Similarly, P-channel FET device Q3 is connected to Vdd. N-channel FET devices Q4 and Q5 are positioned in parallel and connected to the drain electrode of Q3. The combination of Q3, Q4 and Q5 interconnects Vdd to ground potential. Node 1 which is positioned between devices Q1 and Q2 is connected to the gate electrode of Q4. In operation, devices Q1–Q5 bias node 2 such that a desired bias voltage is achieved for most combinations of voltage and parameters. The voltage at node 1 is designed to be about Vdd/2. As the power supply voltage is raised from 4.5 volts to 5.5 volts, the (Vgs−Vt) of Q4 increases by approximately 40%. For devices Q3 and Q5 their Vgs−Vt increases by approximately 30% as Vdd increases from 4.5 to 5.5 volts. To obtain the desired output voltage, the voltage at node 2 must increase only 0.100 volt while Vdd is raised from 4.5 to 5.5 volts. If only device Q5 were used, the voltage at node 2 would rise too much as Vdd increases. The effect of changes on the output voltage as Vdd changes is shown in FIG. 5. If only device Q4 were used, node 2 would decrease as Vdd increases. By choosing the correct device sizes for Q4 and Q5, the desired increase of 0.100 volt at node 2 is achieved.

To compensate for variations in device parameters, the FETs are designed in large and small widths and channel lengths. For best case parameters (highest device current) the output voltage must be higher. Therefore, the voltage at node 2 must decrease for best case (+3 sigma) parameters. The width and length of the device are a nominal value +/− the tolerance.

$$DW = W \text{ nominal} + \text{tolerance} \quad \text{(equation 1)}$$

$$DL = L \text{ nominal} + \text{tolerance} \quad \text{(equation 2)}$$

where D represents Device
W represents Width
L represents Length.

For a device with a large W nominal and L nominal, the current will be insensitive to parameter variations (tolerance). The current in devices with small W nominal and L nominal will increase significantly for best case parameters (+3 sigma) versus worst case parameters (−3 sigma). Device Q3 (FIG. 4) has large geometries and devices Q4 and Q5 have small geometries so that the voltage at node 2 will decrease as parameters vary from −3 sigma to +3 sigma. For example, the following set of parameters are suitable values for devices Q3, Q4, Q5.

|    | Width | Length |
|----|-------|--------|
| Q3 | 50    | 6      |
| Q4 | 20    | 3      |
| Q5 | 10    | 3      |

Tolerance = ±1

Hence, it can be seen that the width to length ratio (W/L) of device Q3 only varies 20% from nominal to +3$\sigma$ while the W/L ratio of Q5 varies by 65% from nominal to 3$\sigma$.

Still referring to FIG. 4, compensation circuit means 16 is comprised of parallel P-channel FET devices Q7 and Q10. In particular, compensation circuit means 16 includes devices Q7 through Q12. These devices compensate for variation in device threshold voltage. Each of the devices is connected in series with N-channel devices Q8 and Q11. Devices Q7 and Q8 are connected at node 4 which in turn is connected to the gate electrode of device Q9. The source electrode of device Q9 is connected to node 2 and the drain electrode is connected to ground potential. Similarly, devices Q10 and Q11 are connected in series at node 5 which is connected to the gate electrode of device Q12. Device Q12 is connected to node 2 and Vdd. In operation, devices Q7–Q12 compensate for variations in device threshold voltage (Vt). When the P-channel threshold voltage Vt is low (Vgs−Vt large) the load device current (such as Q26), FIG. 1, will be too high. Current in device Q7 FIG. 4) will increase and the voltage at node 4 will rise turning on device Q9. Current in device Q9 reduces the voltage at node 2 which reduces the current capability of Q6. The bias voltage rises slightly, reducing the current in the load device and in Q7. When the Vt of the P-channel devices is high (Vgs−Vt minimum), current in the load devices is too low. Current in device Q10 decreases and the voltage at node 5 drops which turns on Q12. Current in Q12 raises the voltage at node 2. A higher voltage at node 2 increases the current at Q6, reducing the bias voltage and increasing current in the load devices. Most combinations of power supply voltage and process parameters of the voltage at nodes 4 and 5 are such that devices Q9 and Q12 are off and do not have any effect on the output voltage.

P-channel device Q13 is connected in series with N-channel device Q14 between Vdd and ground potential. When a signal is applied to the chip power-off input, Vref is forced to Vdd volts and dc power on the chip is deactivated. Similarly, devices Q17 and Q15 deactivate the output of the voltage generator when a signal is applied to the Degate input allowing maximum dc power dissipation. This concludes the detailed description of the preferred embodiment of the present invention.

While the invention has been particularly shown and described with reference to a preferred embodiment thereof, it will be understood by those skilled in the art that various changes in form and details may be made therein without departing from the spirit and scope of the invention.

What is claimed is:

1. A circuit arrangement for generating a voltage to bias static dc power dissipating circuits implemented in CMOS technology comprising:

at least one FET pull-up load device, said one FET pull-up device being coupled to at least one pull-down device; and means coupled to a control gate of said pull-up load device, said means responsive to a plurality of process-dependent parameters including tolerances in device-channel lengths and widths and threshold voltages, to provide a variable biasing voltage to a control gate of the pull-up load device with said variable biasing voltage being at a level that causes the pull-up load device to provide a constant current unaffected by variations in process parameters or supply voltage tolerances.

2. The circuit arrangement of claim 1 wherein the pull-up load device includes a P-channel FET.

3. The circuit arrangement of claim 1 wherein the pull-down device includes N-channel FET device.

4. The circuit arrangement of claim 1 wherein the means includes a first circuit means for generating a first control voltage;

a second circuit means coupled to the first circuit, said second circuit means responsive to the first control voltage to compensate for variation in a first set of device process-dependent parameters including tolerances in channel lengths and widths or variations in power supply output voltages; and a third circuit means coupled to the second circuit means, said third circuit means compensating for variation in a second set of device process dependent parameters including threshold voltage or gate oxide thickness.

5. The circuit arrangement set forth in claim 4 further including a fourth circuit means coupled to the second circuit means; said fourth circuit means operable for inverting a voltage signal generated by the second circuit means; a fifth circuit means coupled to the fourth circuit means; said fifth circuit means operable for degating a signal outputted from the fourth circuit means; and a sixth circuit means coupled to the second circuit means and operable for deactivating power on said circuit arrangement.

6. A circuit arrangement for generating a voltage to bias static dc power dissipating circuits implemented in CMOS technology comprising:

at least one FET pull-up load device, said one FET pull-up device coupled to at least one pull-down device;

means coupled to a control gate of said pull-up load device, said means responsive to a plurality of process-dependent parameters to provide a biasing voltage to a control gate of said pull-up load device with said biasing voltage being at a level that causes the pull-up load device to provide current at a predetermined level unaffected by variations in process parameters or supply voltage tolerances;

said means further including a first circuit means having a pair of N-channel FET devices connected in series for generating a first control voltage;

a second circuit means coupled to the first circuit, said second circuit means responsive to the first control voltage to compensate for variation in a first set of device process-dependent parameters and power supply variations; and a third circuit means coupled to the second circuit means, said third circuit means compensating for variation in a second set of device process dependent parameters.

7. The circuit arrangement of claim 6 wherein the second circuit means includes a supply voltage source, a P-channel FET device coupled to the supply voltage source, a pair of N-channel FET devices coupled in parallel relative to one another and each one coupled in series relative to the P-channel device.

8. The circuit arrangement of claim 6 wherein the third circuit means includes two pairs of series-connected FET devices positioned in a parallel configuration between a voltage supply source and a ground potential; and two switching FET devices connected in series with each switching device having its control electrode connected to a different control node formed between respective pairs of the series-connected FET devices.

9. A voltage generator for biasing static circuits on a CMOS chip comprising in combination:
a power supply;
a control node for attaching to the static circuits;
a first circuit means coupled to the power supply and the control node; said first circuit means operable for generating at the control node a first control voltage which compensates for tolerances in the power supply or device process parameters including gate oxide thickness, channel length or width; and a second circuit means coupled to the control node and operable for adjusting the first control voltage at said control node to compensate for variations caused by device threshold voltage whereby the first and second circuit means causes a constant current to flow through said static circuits.

10. The voltage generator of claim 9 further including a third circuit means coupled to the first circuit means and for deactivating power to the first and second circuit means.

11. A voltage generator for biasing static circuits on a CMOS chip comprising in combination:
a power supply;
a control node for coupling to the static circuit;
a first circuit means coupled to the power supply and the control node; said first circuit means operable for generating at the control node a first control voltage which compensates for tolerances in the power supply or device process parameters;
a second circuit means coupled to the control node and operable for adjusting the control voltage at said control node to compensate for variations caused by device threshold voltage;
a third circuit means coupled to the first circuit means and for deactivating power to the first and second circuit means; and
a fourth circuit means coupled to the second circuit means and operable for deactivating the control node.

* * * * *